US009666739B2

(12) United States Patent
Harley

(10) Patent No.: US 9,666,739 B2
(45) Date of Patent: May 30, 2017

(54) PHOTOVOLTAIC CELL AND LAMINATE METALLIZATION

(71) Applicant: SunPower Corporation, San Jose, CA (US)

(72) Inventor: Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 595 days.

(21) Appl. No.: 13/931,747

(22) Filed: Jun. 28, 2013

(65) Prior Publication Data
US 2015/0004737 A1 Jan. 1, 2015

(51) Int. Cl.
H01L 31/00 (2006.01)
H01L 31/02 (2006.01)
H01L 31/048 (2014.01)
H01L 31/05 (2014.01)

(52) U.S. Cl.
CPC ........ *H01L 31/048* (2013.01); *H01L 31/0504* (2013.01); *H01L 31/0516* (2013.01); *Y02E 10/50* (2013.01)

(58) Field of Classification Search
CPC ... H01L 31/02021; H01L 31/00; H01L 31/02; H01L 31/048; H01L 31/0504; H01L 31/0516; H01L 31/052; H01L 31/055; H01L 31/12; H01L 31/18
USPC ........................................ 438/64, 27, 29, 22
See application file for complete search history.

(56) References Cited

U.S. PATENT DOCUMENTS

| 5,951,786 A | 9/1999 | Gee et al. |
| 5,972,732 A * | 10/1999 | Gee ........................ H01L 31/048 136/244 |
| 6,459,032 B1 * | 10/2002 | Luch ................... H01L 31/0392 136/244 |
| 2008/0216887 A1 | 9/2008 | Hacke et al. |
| 2010/0012172 A1 * | 1/2010 | Meakin ................. H01L 31/048 136/251 |

(Continued)

OTHER PUBLICATIONS

PCT International Search Report and Written Opinion of the International Searching Authority for Application No. PCT/US2014/039813, Oct. 8, 2014, 8 sheets.

*Primary Examiner* — Chuong A Luu
(74) *Attorney, Agent, or Firm* — Okamoto & Benedicto LLP

(57) ABSTRACT

A photovoltaic laminate is disclosed. Embodiments include placing a first encapsulant on a substantially transparent layer that includes a front side of a photovoltaic laminate. Embodiments also include placing a first solar cell on the first encapsulant. Embodiments include placing a metal foil on the first solar cell, where the metal foil uniformly contacts a back side of the first solar cell. Embodiments include forming a metal bond that couples the metal foil to the first solar cell. In some embodiments, forming the metal bond includes forming a metal contact region using a laser source, wherein the formed metal contact region electrically couples the metal foil to the first solar cell. Embodiments can also include placing a backing material on the metal foil. Embodiments can further include forming a back layer on the backing material layer and curing the substantially transparent layer, first encapsulant, first solar cell, metal foil, backing material and back layer to form a photovoltaic laminate.

9 Claims, 16 Drawing Sheets

(56) References Cited

U.S. PATENT DOCUMENTS

| | | |
|---|---|---|
| 2011/0017293 A1 | 1/2011 | Farrell et al. |
| 2011/0056532 A1* | 3/2011 | Ravi .................. H01L 31/0682 |
| | | 136/244 |
| 2011/0120531 A1 | 5/2011 | Nese et al. |
| 2011/0297208 A1 | 12/2011 | Bakker et al. |
| 2012/0000502 A1* | 1/2012 | Wiedeman et al. .......... 136/244 |
| 2012/0017988 A1 | 1/2012 | Moslehi |
| 2012/0204938 A1 | 8/2012 | Hacke et al. |
| 2013/0068287 A1* | 3/2013 | Compaan .......... H01L 21/67173 |
| | | 136/249 |

* cited by examiner

PHOTOVOLTAIC CELL AND LAMINATE METALLIZATION

TECHNICAL FIELD

Embodiments of the subject matter described herein relate generally to photovoltaic assemblies including solar cells, photovoltaic laminates and photovoltaic modules. More particularly, embodiments of the subject matter relate to photovoltaic laminates and fabrication processes.

BACKGROUND

Solar cells are well known devices for converting solar radiation to electrical energy. They can be fabricated on a semiconductor wafer using semiconductor processing technology. A photovoltaic cell or a solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell. Solar cells can be packaged into a photovoltaic laminate using various processes and encapsulant materials, where photovoltaic laminates can be further packaged to into a photovoltaic module. One or more embodiments pertain to photovoltaic cells or solar cells and photovoltaic laminate fabrication processes.

BRIEF SUMMARY

A photovoltaic laminate is disclosed. The photovoltaic laminate can include a substantially transparent layer, a first encapsulant layer on the substantially transparent layer, a solar cell and a metal foil on the solar cell. Embodiments can include a metal bond coupling the metal foil to the first solar cell. In some embodiments, the metal bond can include a metal contact region. Embodiments can also include a backing material on the metal foil and a back layer on the backing material.

A method for metallization for a photovoltaic laminate is disclosed. The method can include placing a first encapsulant on a substantially transparent layer. The method can also include placing a first solar cell on the first encapsulant. The method can include placing a metal foil on the first solar cell, where the metal foil uniformly contacts the first solar cell and forming a metal bond that couples the metal foil to the first solar cell. The method can further include placing a backing material on the metal foil, forming a back layer on the backing material and bonding the substantially transparent layer, first encapsulant, first solar cell, metal foil, backing material and back layer to form a photovoltaic laminate.

Another method for metallization of a photovoltaic laminate is disclosed. The method can include placing a metal foil on a receiving medium. In some embodiments the receiving medium can include a receiving medium selected from the group composed of a substantially transparent layer, sacrificial glass and a perforated medium. The method can include placing a first solar cell on the metal foil. The method can include forming a metal bond that couples the metal foil to the first solar cell. In an embodiment, forming a metal bond can include firing a laser through the receiving medium to the metal foil to form a metal bond or a metal contact region that couples the metal foil to the first solar cell. The method can further include placing a first encapsulant on the first solar cell and placing a substantially transparent layer on the first encapsulant. The method can also include placing a backing material on the metal foil, placing a back layer on the backing material and bonding the substantially transparent layer, first encapsulant, first solar cell, metal foil, backing material and back layer together forming a photovoltaic laminate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
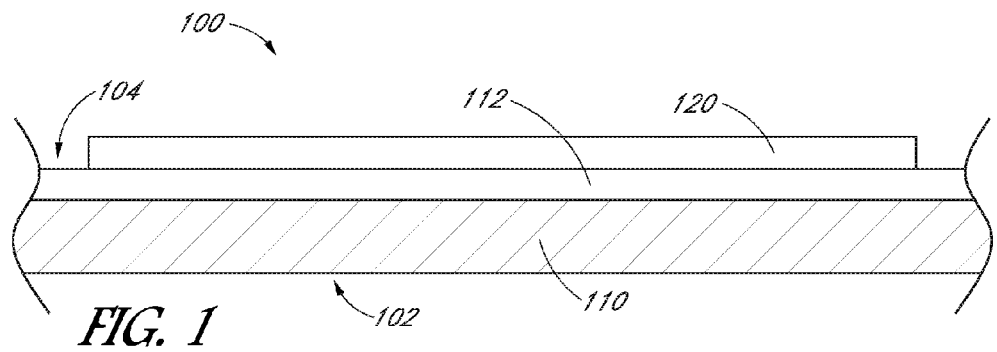
FIGS. 1-7 are cross-sectional representations of a photovoltaic laminate in accordance with a presented method for metallization of a photovoltaic laminate.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of photovoltaic laminates and solar modules that include solar cells for ease of understanding, the disclosed techniques and structures apply equally to other semiconductor structures (e.g., silicon wafers generally).

Improvements in metallization techniques for solar cells, photovoltaic laminates and photovoltaic modules can represent a significant impact in the total fabrication cost and output yield of a photovoltaic module. Solar cells often require multiple steps in manufacturing to allow the manufacturing of a high efficiency cell, where reducing the steps can result in increased manufacturing output yield. Present metallization techniques can also require several steps. These steps can include performing metal formation processes on solar cells such as physical deposition processes (PVD), annealing and plating processes. Subsequent to the solar cell metallization formation processes mentioned, soldering the solar cells can be required to electrically connect multiple solar cells in a photovoltaic module. Therefore, improving such techniques and even removing them altogether can result increase in manufacturing output yield and in significant production cost savings.

To address the above difficulties, and in place of individually forming metal on a solar cell and subsequently soldering metal interconnects to the solar cell, embodiments are presented that involve the use of a metal bond coupling a solar cell to a metal foil and formed in a single step process. Also, the technique of forming metal on a solar cell and bonding metal interconnects to the solar cell can be at least a two step process, where the presented embodiments are formed in a single step process as part of a photovoltaic laminate fabrication. This and other solutions including similar embodiments are discussed in detail below.

Figure 2:
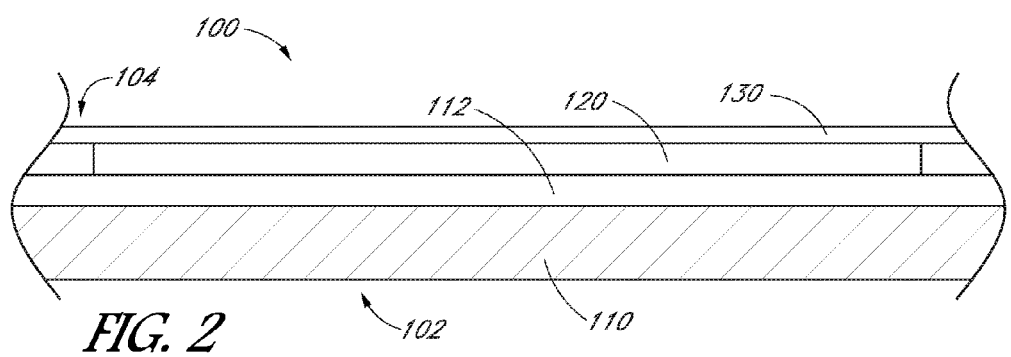
Figure 3:
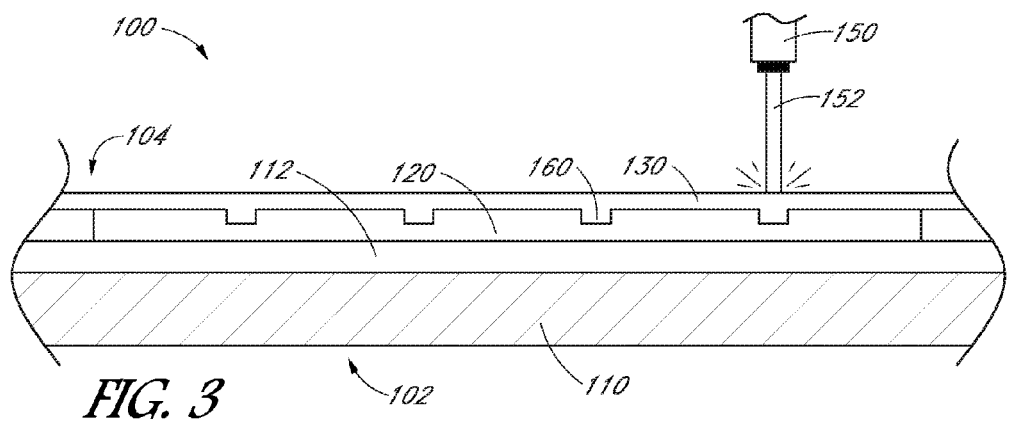
Figure 4:
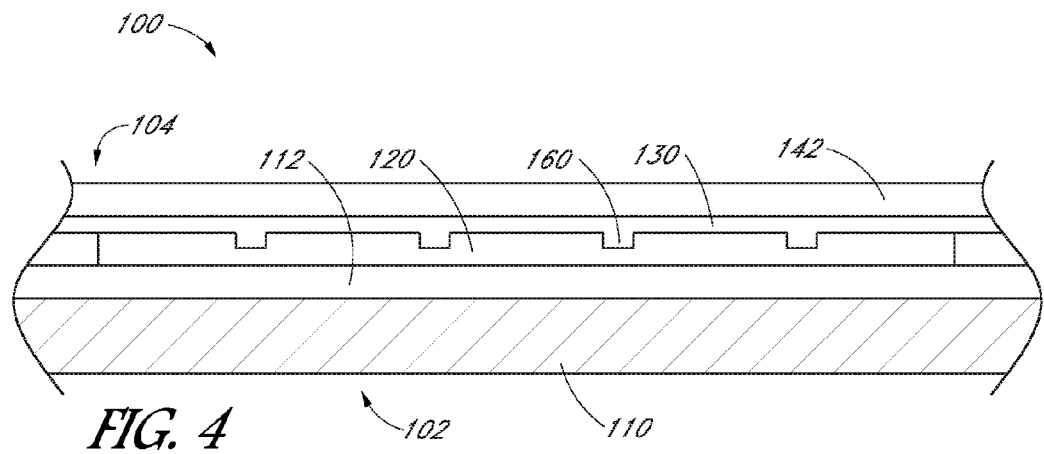
Figure 5:
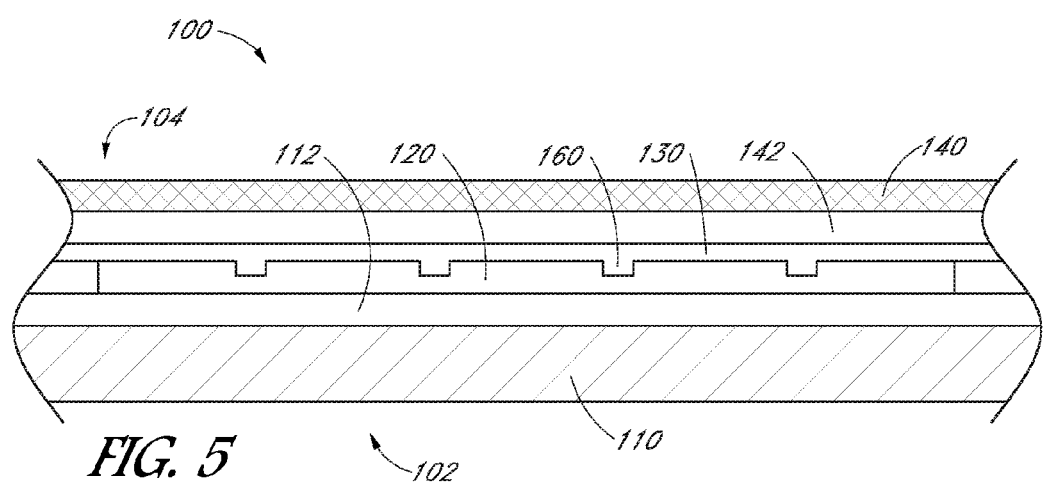
Figure 6:
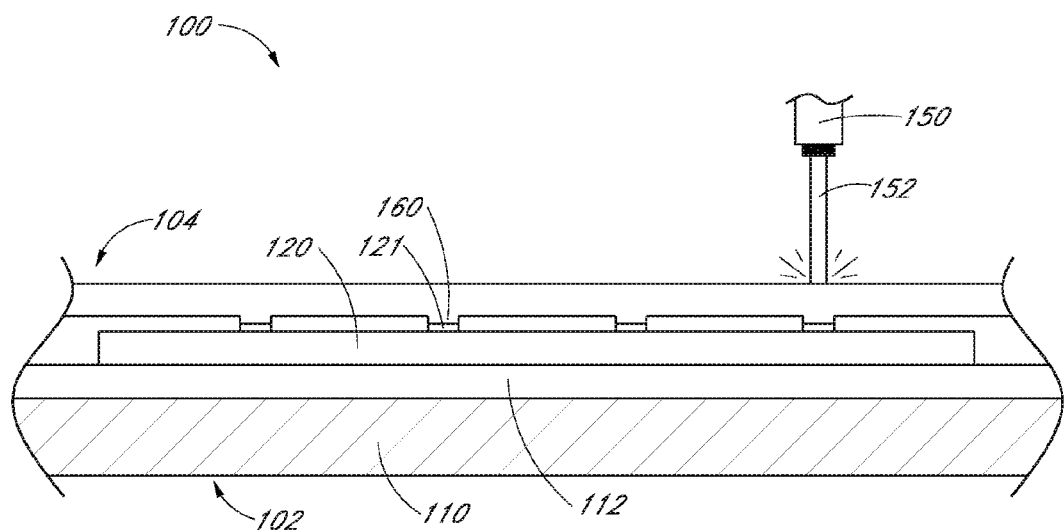
Figure 7:
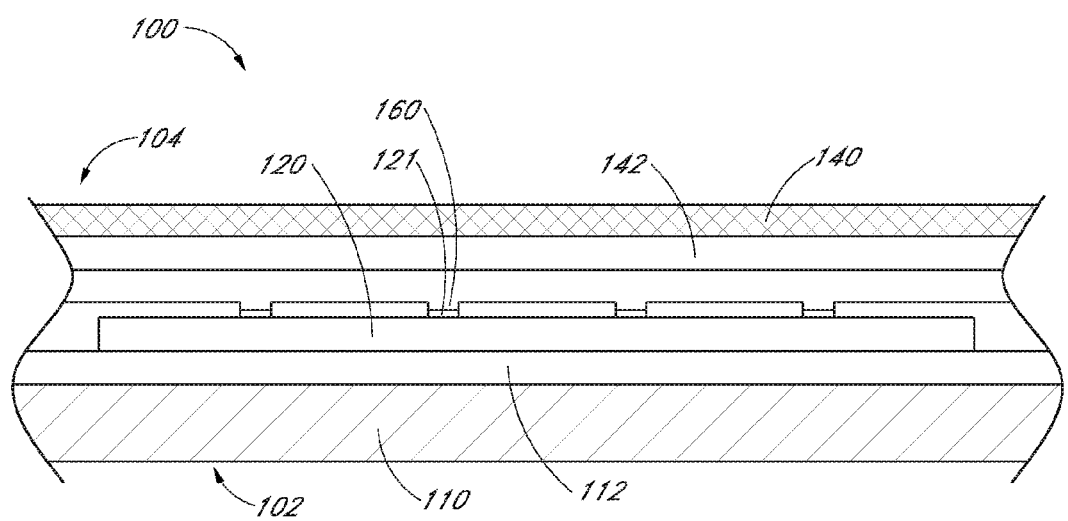

FIGS. 1-7 illustrate a method for metallization for a photovoltaic laminate. The photovoltaic laminate 100 of FIGS. 1-7 having a front side 102 which faces the sun during normal operation and a back side 104 opposite the front side 102. FIGS. 3-5 show an embodiment where a metal foil 130 can be coupled directly to a first solar cell 120 of FIG. 3. FIGS. 6 and 7 show an embodiment where a metal foil 130 can be electrically coupled to a seed metal layer 121 on the first solar cell 120 of FIG. 6.

With reference to FIG. 1, placing a first encapsulant 112 on a substantially transparent layer 110 and placing a first solar cell 120 on the first encapsulant 112 is shown. In some embodiments, the method can include placing a plurality of solar cells on the first encapsulant 112. In an embodiment, the method can include placing a second solar cell on the first encapsulant 112. In another embodiment, before placing a first solar cell 120 on the first encapsulant 112, the method can include sorting a plurality of solar cells, where placing the first and second solar cell is performed according to the sorting. In the embodiment where the placing of the first and second solar cells includes sorting, the method can include sorting a plurality of solar cells according to a method selected from the group composed of visual quality, photoluminescence and electroluminescence test results. In an embodiment, the substantially transparent layer can be glass. In some embodiments, the first encapsulant can be Ethylene-Vinyl Acetate (EVA). In an embodiment, the method can further include aligning the first solar cell 120 to the photovoltaic laminate 100 using a visual system. In the embodiment where the method includes aligning the first solar cell 120 to the photovoltaic laminate 100, the method can also include storing alignment data. In an embodiment, the method can include fixing the first solar cell 120 in place on the first encapsulant 112 using technique selected from the group composed of curing with heat lamps, curing with Ultraviolet (UV) or using any other applicable method. As discussed above, the photovoltaic laminate 100 can have a front side 102 and a back side 104, where the front side 102 is opposite the back side 104.

FIG. 2 illustrates placing a metal foil 130 on the first solar cell 120, where the metal foil 130 uniformly contacts the first solar cell 120. In an embodiment, the metal foil 130 can include a metal foil attached to a carrier medium, where the metal foil is pre-patterned. In some embodiments, the metal foil 130 can include a patterned metal foil and excess metal foil. In the embodiment where the metal foil 130 includes a patterned metal foil and excess metal foil, the method can further include forming the patterned metal foil using a technique selected from the group composed of stamping, mechanical scribing, laser patterning, laser ablation, water patterning, water jetting, masking and etching or any applicable patterning-type process. In an embodiment, the metal foil 130 can include aluminum. In the embodiment where the metal foil 130 is aluminum, the metal foil 130 can have a thickness in the range of 5-100 microns. In some embodiments, a visual system can be used to align the metal foil 130 to the first solar cell 120. In the embodiment which includes storing alignment information as discussed above in FIG. 1, the method can include placing the metal foil 130 on the solar cell 120 according to the stored alignment information. In an embodiment, the metal foil 130 can be fixed on to the first solar 120 cell. In the embodiment where the metal foil 130 is fixed to the first solar cell 120, fixing the metal foil 130 to the first solar cell 120 can include using a method selected from the group composed of curing with heat lamps, curing with Ultraviolet (UV) radiation, rolling the metal foil, pressure, vacuum technique and any other applicable method.

With reference to FIG. 3, forming a metal bond 160 that couples the metal foil 130 to the first solar cell 120 is shown. In an embodiment, forming the metal bond 160 can include forming a metal contact region to couple the metal foil 130 and the first solar cell 120. Embodiments can include using a laser source 150 to fire a laser 152 on the metal foil 130 to form a metal bond 160 or a metal contact region that couples the metal foil 130 to the first solar cell 120. In an embodiment, forming the metal contact region 160 also includes performing a patterning process resulting in patterned metal foil and excess metal foil, forming a metal bond 160 or metal contact region that couples the patterned metal foil to the first solar cell 120 and removing the excess metal foil. Embodiments can include performing instead a laser bonding process. In an embodiment, the metal contact region electrically couples the metal foil 130 to the first solar cell 120. Embodiments can also include forming a metal bond 160 or metal contact region that couples a metal foil 130 attached to a carrier medium to the first solar cell 120, where the metal foil 130 is pre-patterned and removing the carrier medium after forming the metal bond. Embodiments can also include patterning busbars and ribbon from the metal foil 130 using the laser 152 or the same equipment used in the formation of the bond 160 or metal contact region. In an embodiment, the busbars and ribbons can be patterned from the metal foil 130 separately from the formation of the metal bond 160.

FIG. 4 illustrates placing a backing material 142 on the metal foil 130. In an embodiment, the backing material 142 can be a second encapsulant. In some embodiments, the second encapsulant can be Ethylene-Vinyl Acetate (EVA). In an embodiment, prior to placing a backing material 142, connecting a metal busbar to the metal foil 130 to allow for electrical conduction to and from the photovoltaic laminate 100. Embodiments can include depositing a backing layer 142 on the metal foil 130, where the backing layer 142 can include silicone.

With reference to FIG. 5, forming a back layer 140 on the backing material 142 is shown. In an embodiment, the method can also be performed without a backing material 142, where the back layer 140 can be placed directly on the metal foil 130. In an embodiment, the backing material 142 can be a second encapsulant. In some embodiments, the second encapsulant can be Ethylene-Vinyl Acetate (EVA). Embodiments can include a combined back layer including a backing material 142. The method can also include bonding the substantially transparent layer 110, first encapsulant 112, first solar cell 120 of FIG. 3, metal foil 130, second encapsulant 142 and back layer 140 to form a photovoltaic laminate 100. In an embodiment, the second encapsulant 142 can be of Ethylene-Vinyl Acetate (EVA). In an embodiment, the back layer 140 is composed of a backsheet commonly used in the fabrication of photovoltaic laminates. Embodiments can include the back layer 140 can be Polyethylene. In an embodiment, the method can include attaching a frame around the photovoltaic laminate 100 subsequent to bonding and forming an electrical junction box on the back layer 140 after attaching the frame to form a photovoltaic module. Embodiments can include performing a method selected from the group consisting of curing, thermal curing, curing with Ultraviolet (UV) light and performing a standard lamination process to form the photovoltaic laminate. In some embodiments, a visual system is used to align the backing material 142 or the back layer 140 to the first solar cell 120.

FIG. 6 illustrates another embodiment for metallization, the embodiment can include forming a metal bond 160 that couples the metal foil 130 to a seed metal layer 121 on the first solar cell 120. The method can include providing a solar cell 100 of FIG. 6 including a seed metal layer 121. In an embodiment, forming the metal bond 160 can include forming a metal contact region to couple the metal foil 130 and the seed metal layer 121 of the first solar cell 120. Embodiments can also include using a laser source 150 to fire a laser 152 on the metal foil 130 to form a metal bond 160 or a metal contact region that couples the metal foil 130 to the seed metal layer 121. In an embodiment, forming the metal bond 160 can also include performing a patterning process resulting in patterned metal foil and excess metal foil, forming a metal bond 160 or metal contact region that couples the patterned metal foil to the seed metal layer 121 and removing the excess metal foil. Embodiments can include performing a laser bonding process. Embodiments can also include forming a metal bond 160 or metal contact region that couples a metal foil 130 attached to a carrier medium to the seed metal layer 121, where the metal foil 130 is pre-patterned and removing the carrier medium after forming the metal bond 160. In an embodiment, forming the metal bond 160 can include performing a soldering process, laser welding, welding, using heat or thermal energy, using an ultrasonic process or any applicable method to form metal bond 160 between the metal foil 130 and the seed metal layer 121 of the first solar cell 120. Embodiments can also include patterning busbars and ribbon from the metal foil 130 using the same laser 152 or equipment used in the formation of the metal bond 160 or metal contact region. In an embodiment, the busbars and ribbons can be patterned from the metal foil 130 separately from the formation of the metal bond 160.

With reference to FIG. 7, forming a back layer 140 on a backing material 142 is shown. In an embodiment, the backing material 142 can be a second encapsulant. In some embodiments, the second encapsulant can be Ethylene-Vinyl Acetate (EVA). The method also includes bonding the substantially transparent layer 110, first encapsulant 112, first solar cell 120 of FIG. 6 including a seed metal layer 121, metal foil 130, backing material 142 and back layer 140 to form a photovoltaic laminate 100 of FIG. 7. Embodiments can include, the back layer 140 can be a backsheet commonly used in the fabrication of photovoltaic laminates. In an embodiment, the back layer 140 can be Polyethylene. Embodiments can include attaching a frame around the photovoltaic laminate 100 subsequent to bonding and forming an electrical junction box on the back layer 140 after attaching the frame to form a photovoltaic module. In an embodiment, bonding to form a photovoltaic laminate 100 can include performing a method selected from the group consisting of curing, thermal curing, curing with Ultraviolet (UV) light and performing a standard lamination process to form the photovoltaic laminate. In some embodiments, a visual system can be used to align the backing material 142 to the first solar cell 120. Embodiments can include a combined back layer including a backing material 142. In an embodiment, the method can also be performed without a backing material 142, where the back layer 140 can be placed directly on the metal foil 130.

Figure 12:
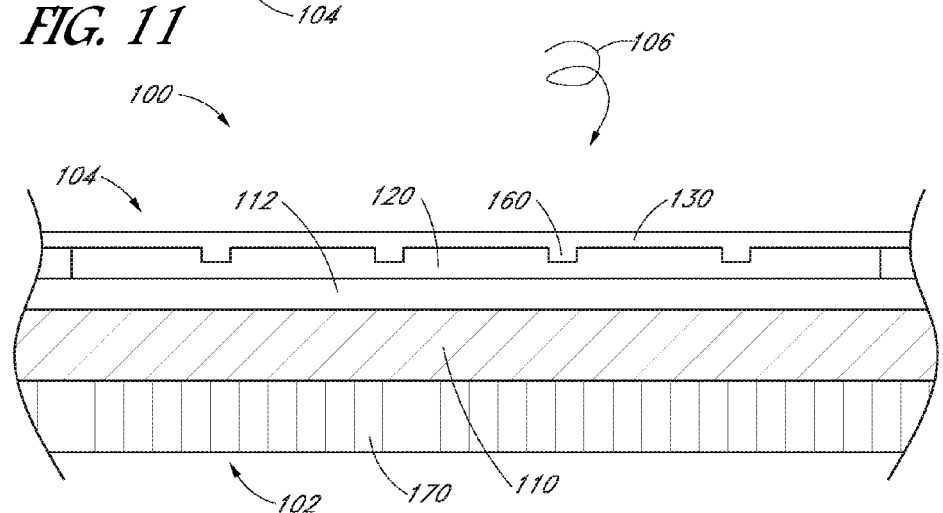
Figure 13:
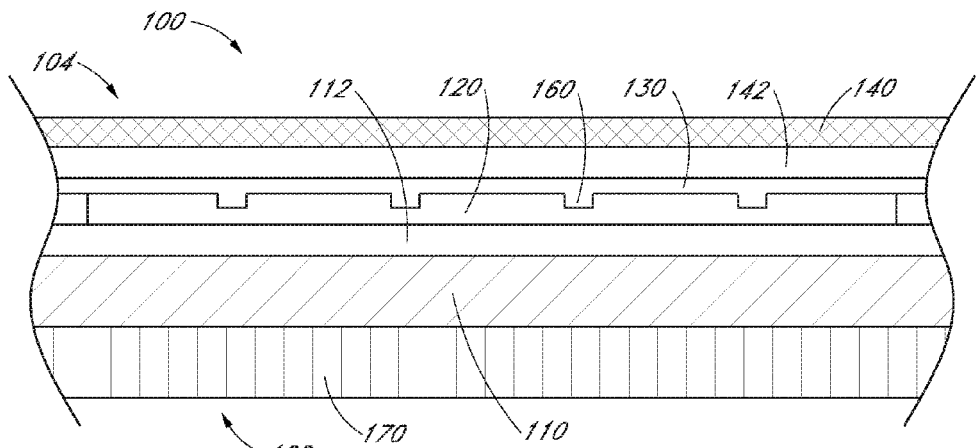
Figure 14:
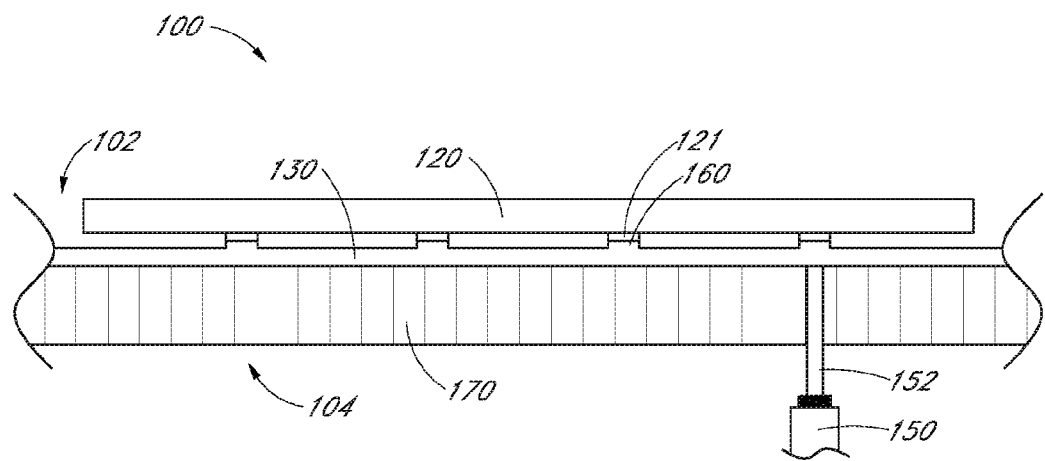
Figure 15:
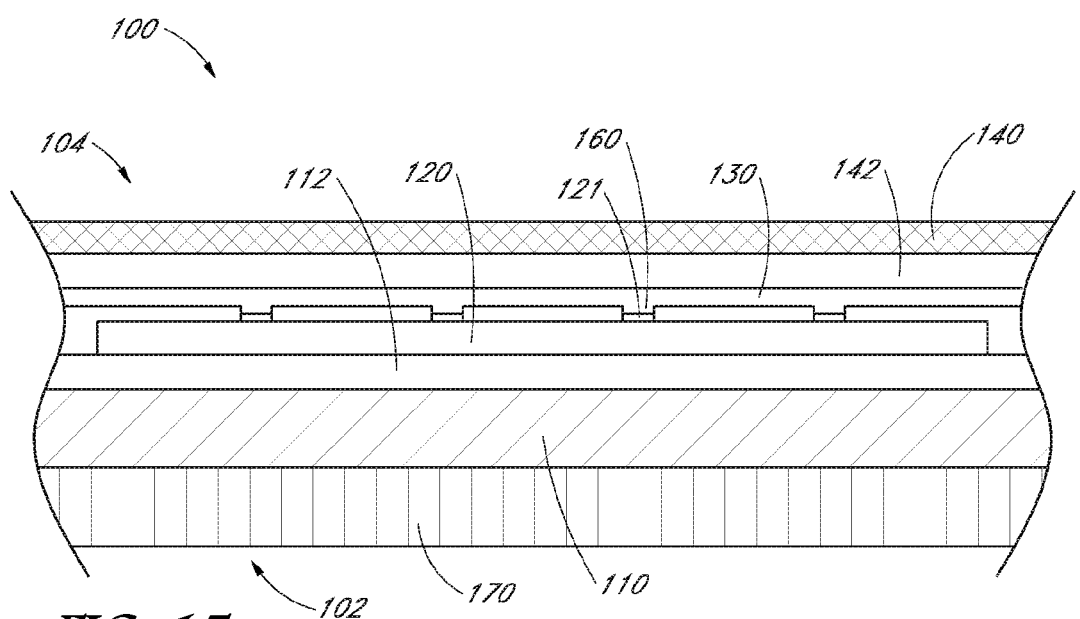

With reference to FIGS. 8-15, another method for metallization for a photovoltaic laminate is shown. The photovoltaic laminate 100 of FIGS. 8-15 having a front side 102 which faces the sun during normal operation and a back side 104 opposite the front side 102. Also FIGS. 10-13 show an embodiment where a metal foil 130 can be electrically coupled directly to a first solar cell 120 of FIG. 10. FIGS. 14 and 15 show an embodiment where a metal foil 130 can be electrically coupled to a seed metal layer 121 on the first solar cell 120 of FIG. 14.

Figure 8:
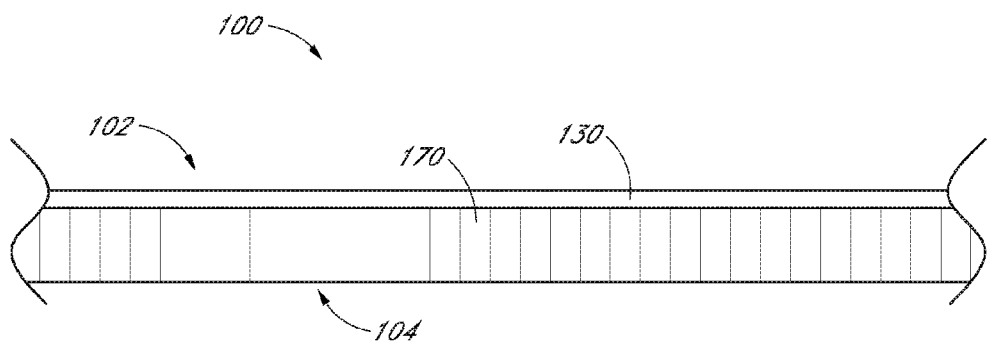
FIGS. 8-15 are cross-sectional representations of a photovoltaic laminate in accordance with another presented method for metallization of a photovoltaic laminate.

Referring to FIG. 8, placing a metal foil 130 on a receiving medium 170 is shown. In some embodiments the receiving medium 170 can include a receiving medium selected from the group that can include a substantially transparent medium, sacrificial glass, glass, polymer material, a transparent non-absorbing to laser radiation material and a perforated medium. In an embodiment, the metal foil 130 uniformly contacts the receiving medium 170. Embodiments can also include attaching the metal foil 130 to a carrier medium, where the metal foil is pre-patterned. In some embodiments, the metal foil 130 can include a patterned metal foil and excess metal foil. In the embodiment where the metal foil 130 can include a patterned metal foil and excess metal foil, the method can further include forming the patterned metal foil and excess metal foil using a technique selected from the group composed of stamping, mechanical scribing, laser patterning, laser ablation, water patterning, water jetting, masking and etching or any applicable patterning-type process. In an embodiment, the metal foil 130 can be aluminum. In the embodiment where the metal foil 130 is aluminum, the metal foil 130 can have a thickness in the range of 5-100 microns. In some embodiments, a visual system can be used to align the metal foil 130 to the receiving medium 170. In an embodiment, the metal foil 130 can be fixed on to the receiving medium 170. In the embodiment where the metal foil 130 is fixed to the receiving medium 170, fixing the metal foil 130 to the receiving medium 170 can include using a method selected from the group composed of curing with heat lamps, curing with Ultraviolet (UV) radiation, rolling the metal foil, pressure, vacuum technique and using any applicable method.

Figure 9:
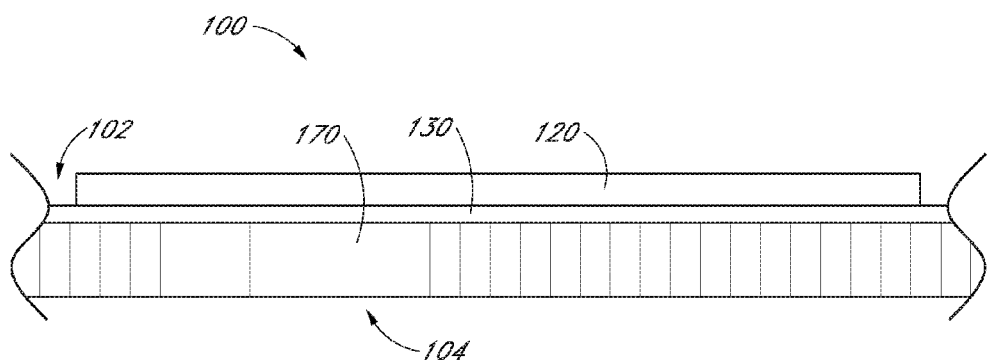

With reference to FIG. 9, placing a first solar cell 120 on the metal foil 130 of the photovoltaic laminate of FIG. 8 is shown. In some embodiments, the method can include placing a plurality of solar cells on the metal foil 130. For example, the method can also include placing a second solar cell on the metal foil 130. In some embodiments, before placing a first and second solar cell 120 on the metal foil 130, the method can include sorting a plurality of solar cells, and where placing the first and second solar cell can be performed according to the sorting. In the embodiment that includes sorting, the sorting can be performed according to visual quality, photoluminescence and electroluminescence test results, among other examples.

Figure 10:
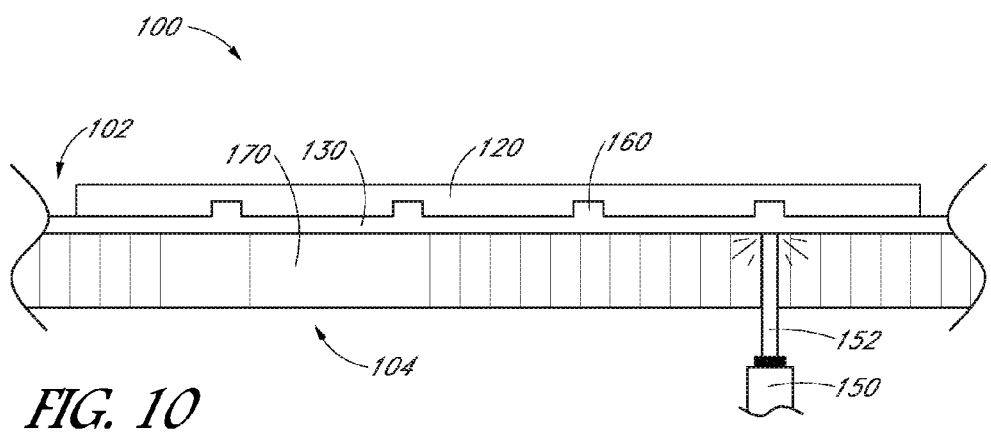

FIG. 10 illustrates forming a metal bond 160 that couples the metal foil 130 to the first solar cell 120. In an embodiment, the method can include forming a metal contact region to couple the metal foil 130 and the first solar cell 120. Embodiments can also include, forming the metal bond 160 or metal contact region 160 to couple the metal foil 130 and the first solar cell 120. In an embodiment, the method can include using a laser source 150 to fire a laser 152 through the receiving medium 170 to the metal foil 130 to form a metal bond 160 or a metal contact region 160 that couples the metal foil 130 to the first solar cell 120. Embodiments can include performing a laser patterning process resulting in patterned metal foil and excess metal foil, forming a metal bond 160 or metal contact region that couples the patterned metal foil to the first solar cell 120 and removing the excess metal foil. In an embodiment, the method can include forming a metal bond 160 or a metal contact region that couples a metal foil 130 attached to a carrier medium to the first solar cell 120, where the metal foil 130 is pre-patterned and removing the carrier medium after forming the metal bond 160. Embodiments can include patterning busbars and ribbons from the metal foil 130 using the laser 152 or the same equipment used in the formation of the metal bond 160. In an embodiment, busbars and ribbons can be patterned from the metal foil 130 in a separate process from the formation of the metal bond 160. In the embodiment which includes forming a metal bond 160 or a metal contact region 160, the method can further include modifying laser process parameters to prevent damage to the solar cell 120. In an embodiment, the receiving medium 170 is transparent to the laser 152.

Figure 11:
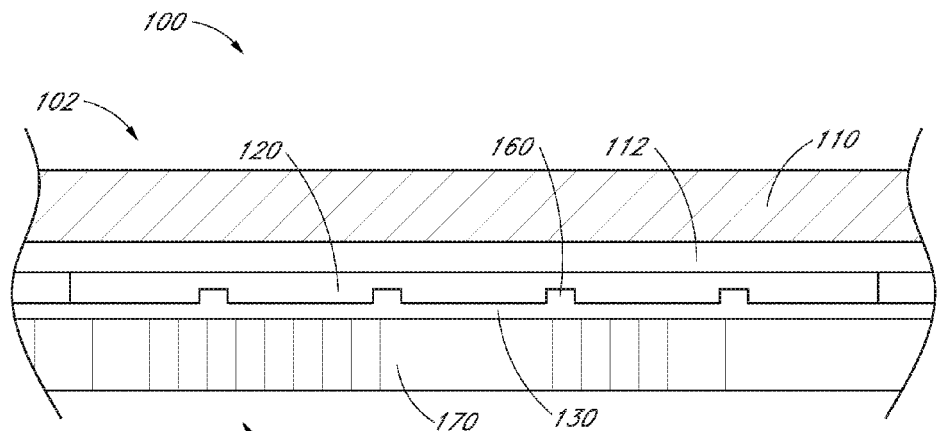

Referring to FIG. 11, placing a first encapsulant 112 on the first solar cell 120 and placing a substantially transparent layer 110 on the first encapsulant 112 are shown. In an embodiment, and similar to that discussed above, the substantially transparent layer is composed of glass. In some embodiments, the first encapsulant is composed of Ethylene-Vinyl Acetate (EVA).

FIG. 12 illustrates the photovoltaic laminate 100 being reoriented 106 such that the front side 102 faces the receiving medium 170. Reorienting the photovoltaic laminate 100 can be performed to allow for easily placing a backing material 142 and a back layer 140 from a top side, where the backing material 142 and back layer can also be fitted from a bottom side.

With reference to FIG. 13, placing a backing material 142 on the metal foil 130 and placing a back layer 140 on the backing material 142 is shown. The method also includes bonding the substantially transparent layer 110, first encapsulant 112, first solar cell 120, metal foil 130, backing material 142 and back layer 140 together forming a photovoltaic laminate 100. In an embodiment, the method can also be performed without a backing material 142, where the back layer 140 can be placed directly on the metal foil 130. In an embodiment, the backing material 142 can be a second encapsulant. In some embodiments, the second encapsulant can be Ethylene-Vinyl Acetate (EVA). Embodiments can include a combined back layer including a backing material 142. In another embodiment, the back layer 140 is a backsheet commonly used in the fabrication of solar modules. In still another embodiment, the back layer 140 is composed of Polyethylene. Also, all the embodiments, descriptions and details described above for the photovoltaic laminate 100 can also apply to the photovoltaic laminate of FIGS. 10-13.

FIG. 14 illustrates forming a metal bond 160 that couples the metal foil 130 to a seed metal layer 121 on the first solar cell 120. Embodiments can also include, forming the metal bond 160 to couple the metal foil 130 and the first solar cell 120. In an embodiment, the method can include using a laser source 150 to fire a laser 152 through the receiving medium 170 to the metal foil 130 to form a metal bond 160 or a metal contact region that couples the metal foil 130 to the seed metal layer 121 of the first solar cell 120. Embodiments can include performing a laser patterning process resulting in patterned metal foil and excess metal foil, forming a metal bond 160 or metal contact region that couples the patterned metal foil to the seed metal layer 121 of the first solar cell 120 and removing the excess metal foil. In an embodiment, the method can include forming a metal bond 160 or a metal contact region that couples a metal foil 130 attached to a carrier medium to the seed metal layer 121 of the first solar cell 120, where the metal foil 130 is pre-patterned and removing the carrier medium after forming the metal bond 160. Embodiments include performing a laser bonding process. In an embodiment, forming the metal bond 160 can include performing a laser welding, welding, soldering process, using heat or thermal energy, using an ultrasonic process or any applicable method to form metal bond 160 between the metal foil 130 and the seed metal layer 121 of the first solar cell 120.

With reference to FIG. 15, placing a backing material 142 on the metal foil 130 and placing a back layer 140 on the backing material 142 is shown. The method also includes bonding the substantially transparent layer 110, first encapsulant 112, first solar cell 120, metal foil 130, backing material 142 and back layer 140 together forming a photovoltaic laminate 100. Also, all applicable embodiments, descriptions and details described above for the photovoltaic laminate 100 can also be used with the embodiment described herein. In an embodiment, the receiving medium 170 is transparent to the laser 152. Embodiments include patterning the solar cell 120 to allow support in regions where the patterning or metal bond 160 formation does not take place.

With reference to FIGS. 16-23, a schematic plan view of the method for metallization for a photovoltaic laminate is shown, as described herein.

Figure 16:
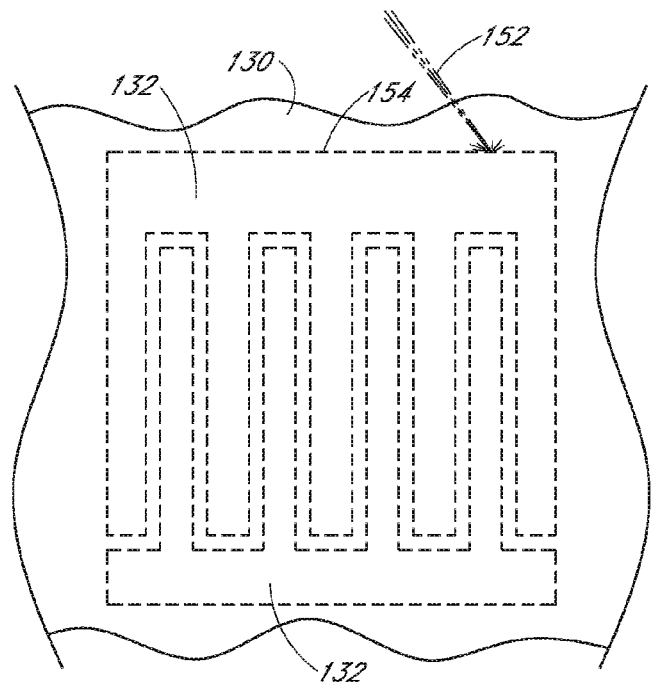
FIGS. 16-23 are schematic plan views of a solar cell in accordance with the presented methods of FIGS. 1-15 for metallization of a photovoltaic laminate.

FIG. 16 illustrates patterning 154 the metal foil 130 using a laser 152 to forming a pattern 154 on the metal foil 132 and a patterned metal foil 132. In an embodiment, the metal foil 130 is patterned in-situ.

Figure 17:
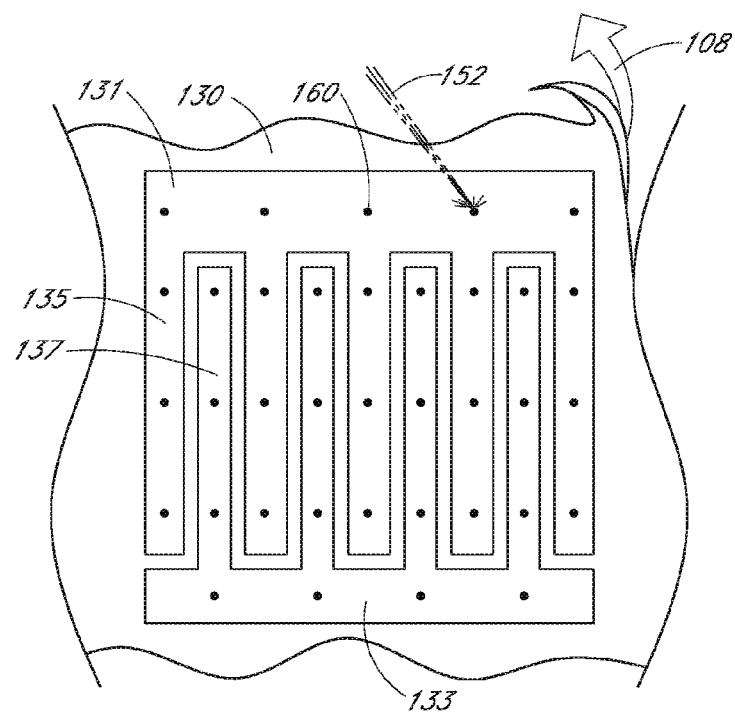

With reference to FIG. 17, forming a metal bond 160 after the formation of the patterned metal foil 132 including a first and second bus bar region 131, 133 and a first and second contact finger 135, 137 is shown. In an embodiment, the method can include peeling off 108 the excess metal foil.

Figure 18:
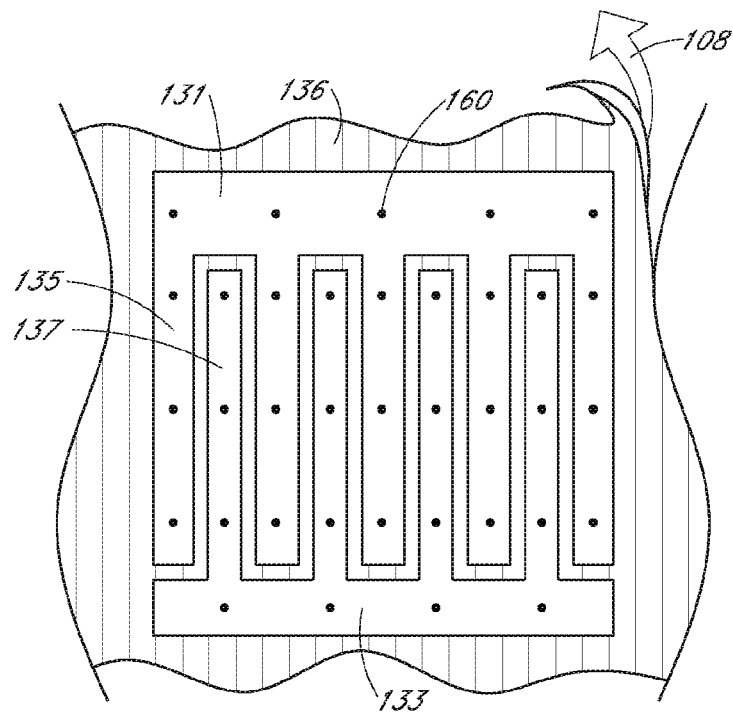

FIG. 18 shows an embodiment where the metal foil or patterned metal foil 132 can be attached to a carrier medium 136, where the carrier medium 136 can be subsequently removed after the formation of the metal contact region 160. In an embodiment, the carrier medium 136 is removed before the formation of the metal contact region 160. In another embodiment, the carrier medium is composed of a material selected from the group including paper, Ethylene-Vinyl Acetate (EVA), polymeric layer, Polyethylene, any generic plastic and any other type of applicable carrier-type material. The method can include peeling off 108 the carrier medium 136.

Figure 19:
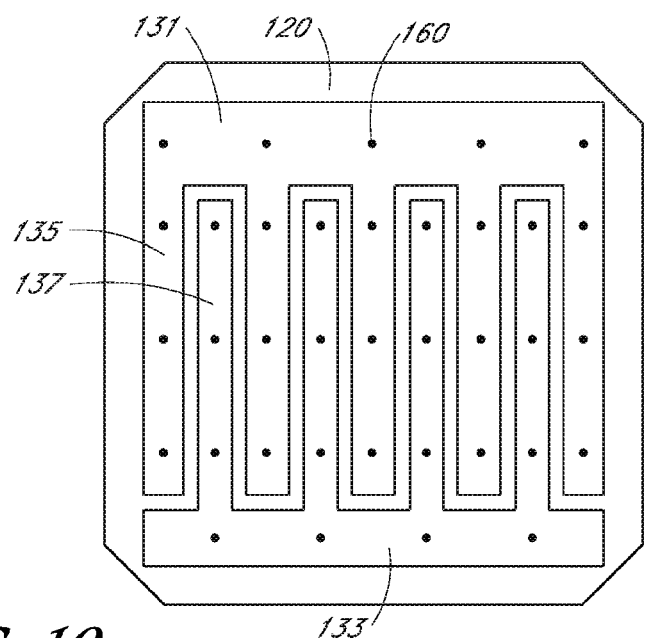

With reference to FIG. 19, the solar cell 120 is shown after removing the excess metal foil, where the patterned foil 132 is electrically coupled to the solar cell 120 through the metal contact regions 160. In some embodiments, the excess metal foil is removed prior to the formation of the metal contact region 160. Also, the method can include forming patterned metal foil including a first and second busbar region 131, 133 and a first and second contact finger 135, 137 on the first solar cell 120.

Figure 20:
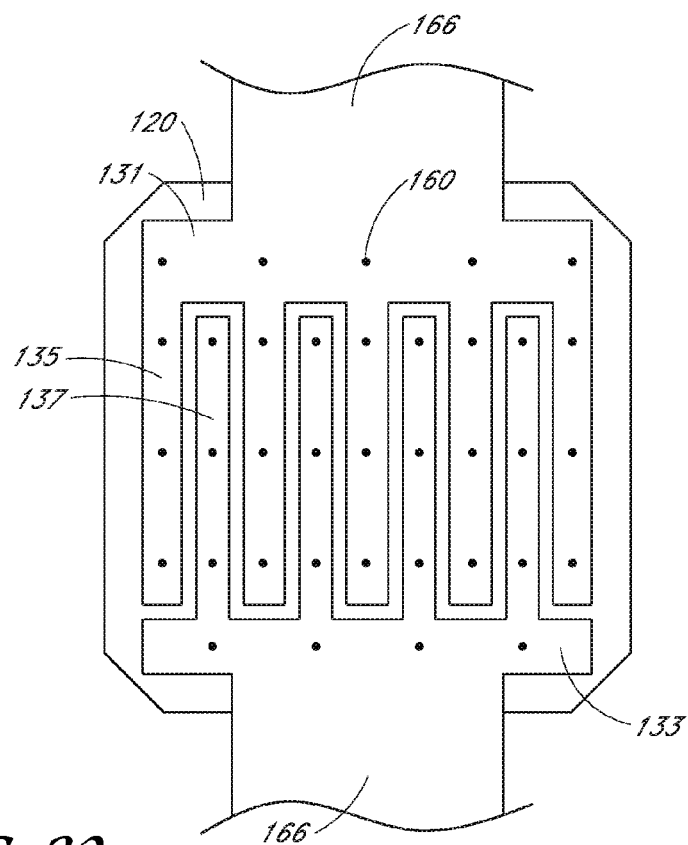

FIG. 20 illustrates an embodiment where the patterned metal foil includes an interconnect 166, where the interconnect 166 allows for electrical conduction to connected solar cells.

Figure 21:
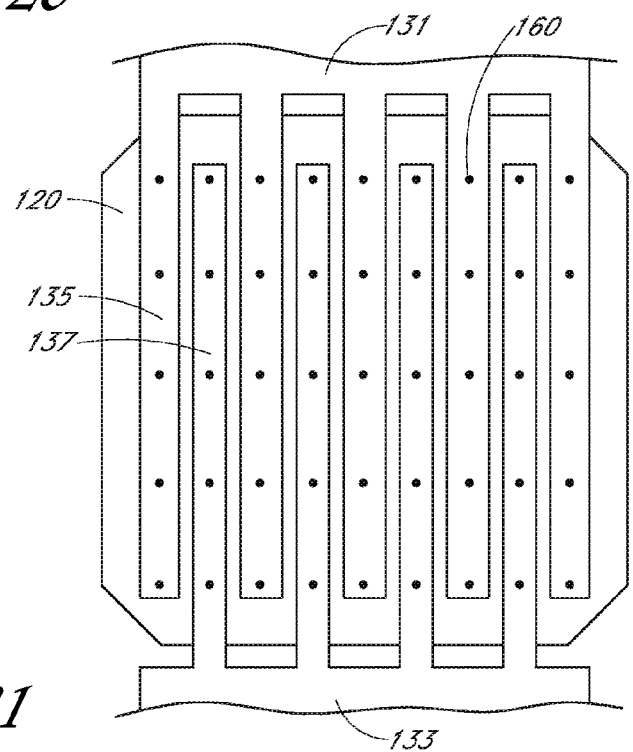

With reference to FIG. 21, an embodiment is shown where the first and second busbar 131, 133 are patterned off the first solar cell 120.

Figure 22:
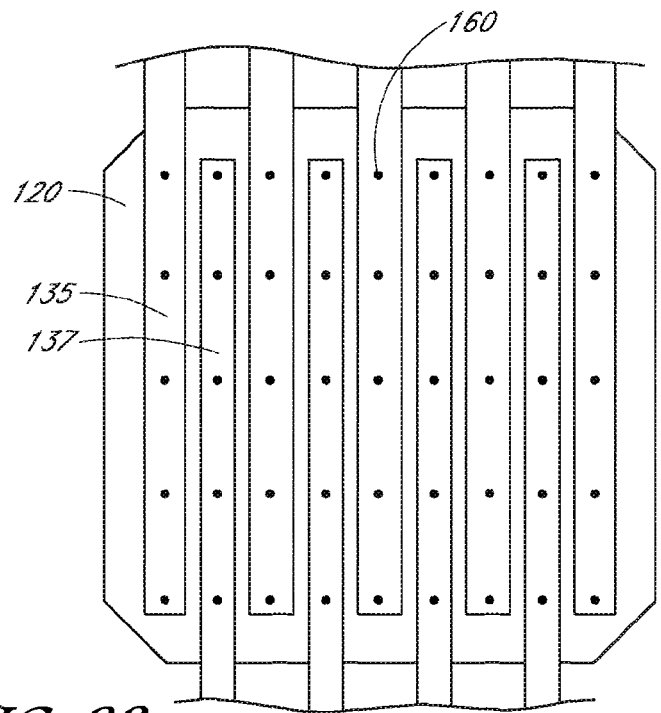

FIG. 22 illustrates an embodiment where the contact fingers, including the first and second contact fingers 135, 137 can extend off the first solar cell 120.

Figure 23:
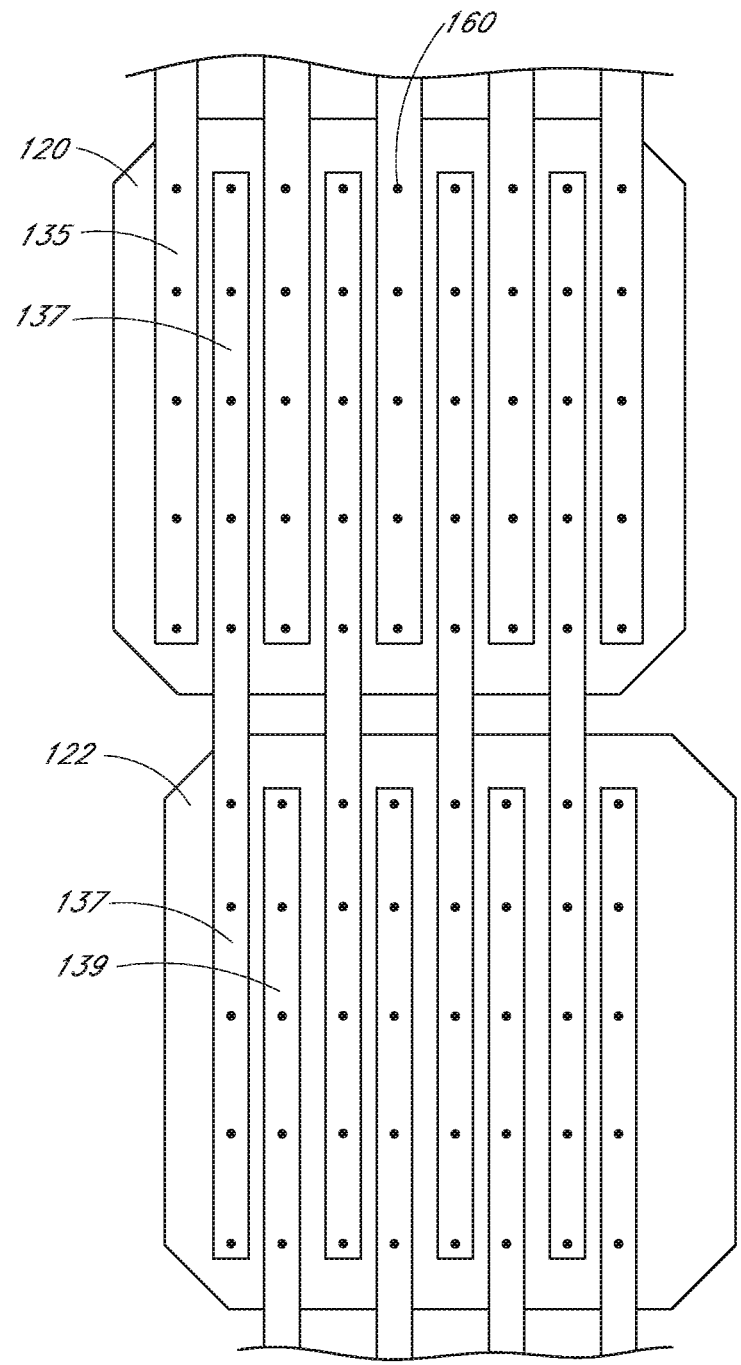

With reference to FIG. 23, an embodiment is shown where the contact fingers extend beyond a first solar cell 120 to a second solar cell 122, the design allowing for electrical conduction between solar cells. In an embodiment, the first and second solar cells 120, 122 can be offset such that the P-type and N-type regions on a first solar cell 120 can be aligned in an alternating manner to a second solar cell 122, allowing for patterning a plurality of contact fingers, such as a first, second and third contact finger 135, 137 and 139 extend across solar cells and electrically couple the first solar cell 120 to the second solar cell 122.

Figure 24:
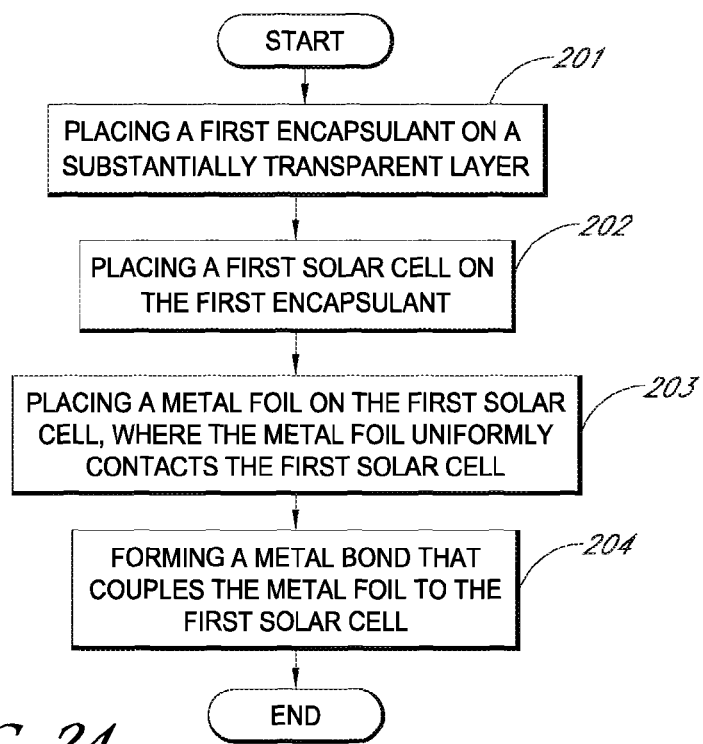
FIGS. 24-29 are flow chart representations of methods for metallization of a photovoltaic laminate.

FIG. 24 illustrates a flow chart of an embodiment for a method of metallization for a photovoltaic laminate. As described above, the first operation 201 can include placing a first encapsulant on a substantially transparent layer. A second operation 202 can include placing a first solar cell on the first encapsulant. A third operation 203 can include placing a metal foil on the first solar cell, where the metal foil uniformly contacts the first solar cell. A last operation 204 can include forming a metal bond that couples the metal foil to the first solar cell.

Figure 25:
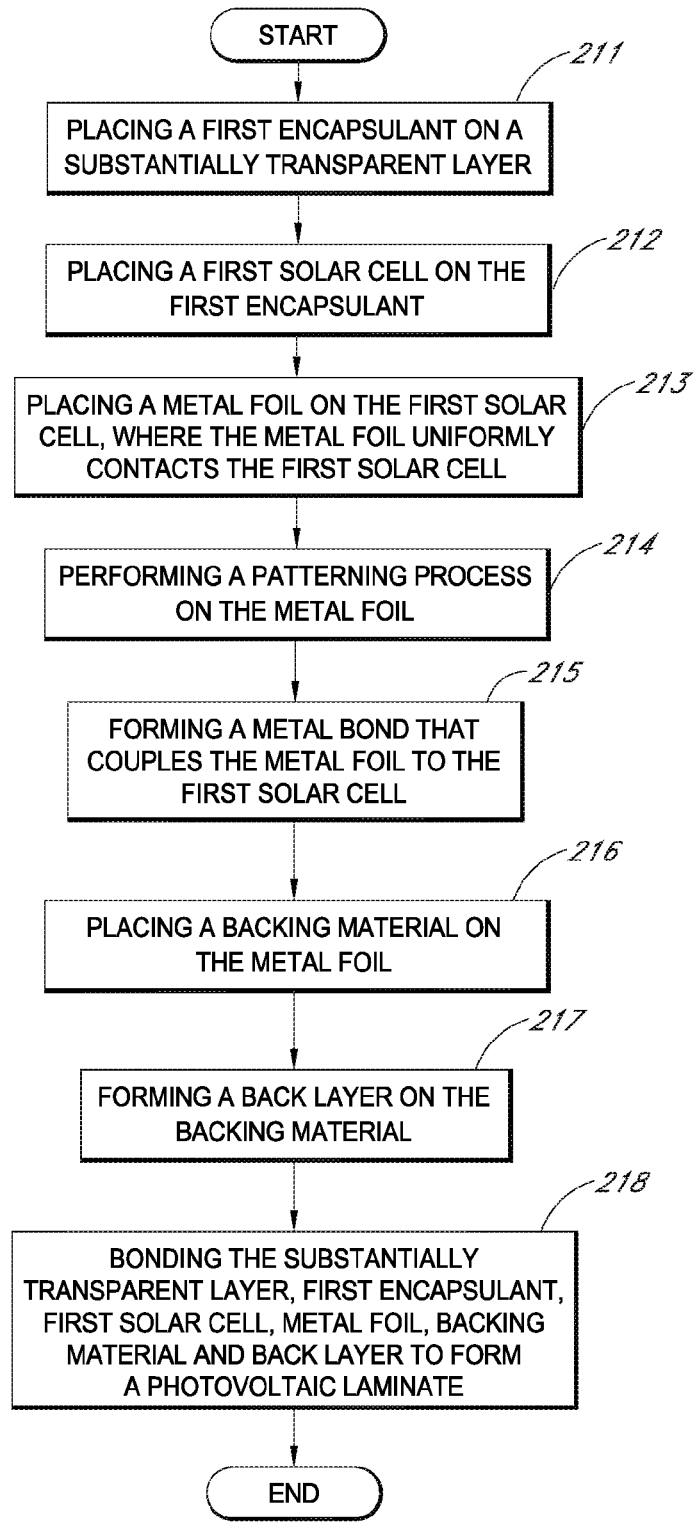

With reference to FIG. 25, a flow chart of another embodiment for a method of metallization for a photovoltaic laminate is shown. As described above, the first operation 211 can include placing a first encapsulant on a substantially transparent layer. Embodiments of the first operation 211 include placing a first encapsulant on a substantially transparent layer that includes the front side of the photovoltaic laminate. A second operation 212 can include placing a first solar cell on the first encapsulant. A third operation 213 can include placing a metal foil on the first solar cell, where the metal foil uniformly contacts the first solar cell. A fourth operation 214 can include performing a patterning process on the metal foil. Embodiments of the fourth operation 214 also include forming a metal bond that couples the metal foil to the first solar cell. A fifth operation 215 can include forming a metal bond that couples the metal foil to the first solar cell. A sixth operation 216 can include placing a backing material on the metal foil. A seventh operation 217 can include forming a back layer on the backing material. A last operation 218 can include bonding the substantially transparent layer, first encapsulant, first solar cell, metal foil, backing material and back layer to form a photovoltaic laminate. Embodiments of the last operation 218 also include curing the substantially transparent layer, first encapsulant, first solar cell, metal foil, backing material and back layer to form a photovoltaic laminate.

Figure 26:
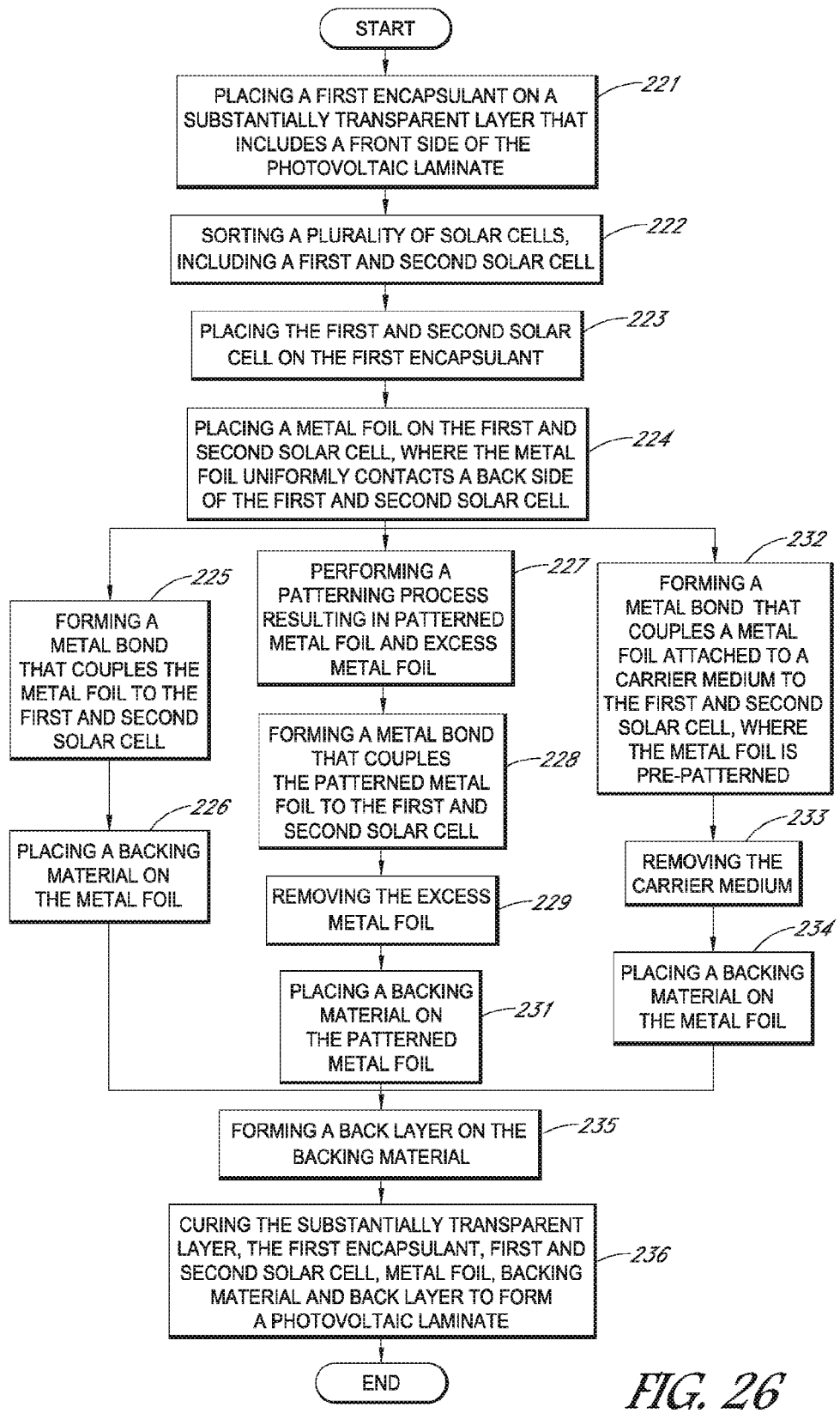

FIG. 26 illustrates a flow chart of still another embodiment for a method of metallization for a photovoltaic laminate. As described above, the first operation 221 can include placing a first encapsulant on a substantially transparent layer that includes a front side of the photovoltaic laminate. A second operation 222 can include sorting a plurality of solar cells, including a first and second solar cell. A third operation 223 can include placing the first and second solar cell on the first encapsulant. A fourth operation 224 can include placing a metal foil on the first and second solar cell, where the metal foil uniformly contacts a back side of the first and second solar cell. A fifth operation can include two steps, a first step 225 can include forming a metal bond that couples the metal foil to the first and second solar cell and a second step 226 can include placing a backing material on the metal foil. Embodiments of the fifth operation can include four steps, a first step 227 can include performing a patterning process resulting in patterned metal foil and excess metal foil, a second step 228 can include forming a metal bond that couples the patterned metal foil to the first and second solar cell, a third step can include removing the excess metal foil and a fourth step 231 can include placing a backing material on the patterned metal foil. Embodiments of the fifth operation can also include three steps, a first step 232 can include forming a metal bond that couples a metal foil attached to a carrier medium to the first and second solar cell, where the metal foil is pre-patterned, a second step 233 can include removing the carrier medium and a third step 234 can include placing a backing material on the metal foil. A sixth operation 235 can include forming a back layer on the backing material. A last operation 236 can include curing the substantially transparent layer, first encapsulant, first and second solar cell, metal foil, backing material and back layer to form a photovoltaic laminate. As discussed above, the placing a first and second solar cell illustrates the above methods can be used with a plurality of solar cells and not just one or two solar cells.

Figure 27:
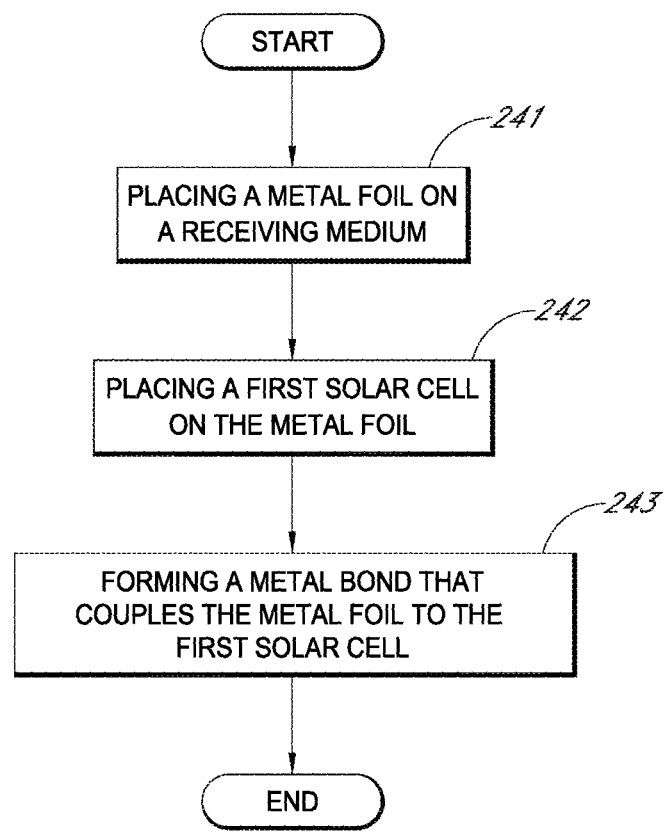

With reference to FIG. 27, a flow chart of yet another embodiment for a method of metallization for a photovoltaic laminate is shown. As described above, the first operation 241 can include placing a metal foil on a receiving medium. A second operation 242 can include placing a first solar cell on the metal foil. A last operation 243 can include forming a metal bond that couples the metal foil to the first solar cell.

Figure 28:
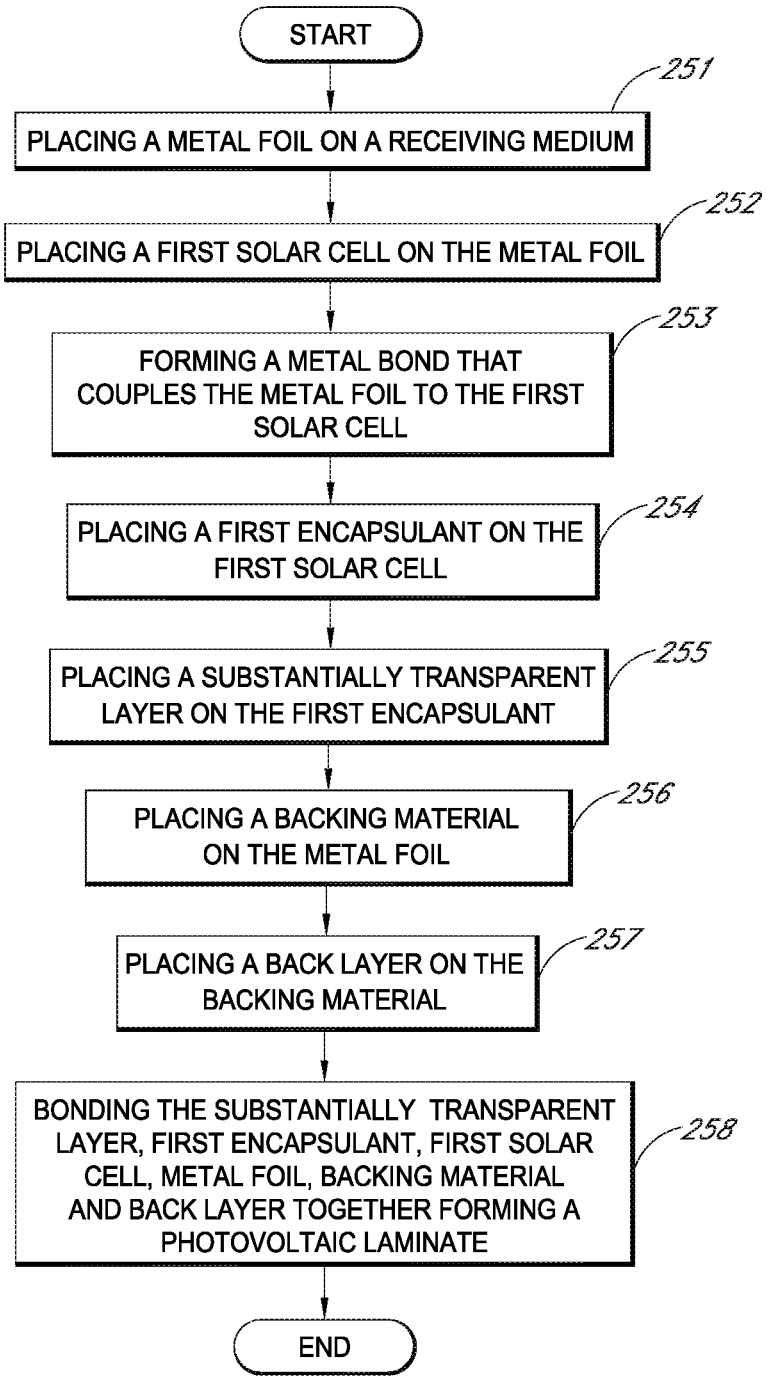

FIG. 28 illustrates a flow chart of an embodiment for a method of metallization for a photovoltaic laminate. As described above, the first operation 251 can include placing a metal foil on a receiving medium. Embodiments of the first operation 251 can include rolling a metal foil on a receiving medium. In an embodiment of the first operation 251, the receiving medium can be substantially transparent. A second operation 252 can include placing a first solar cell on the metal foil. Embodiments of the second operation 252 can include placing a first solar cell on the metal foil, wherein the metal foil uniformly contacts a back side of the first solar cell. A third operation 253 can include forming a metal bond that couples the metal foil to the first solar cell. Embodiments of the third operation 253 can include firing a laser through the receiving medium to the metal foil to form a metal bond that couples the metal foil to the first solar cell. A fourth operation 254 can include placing a first encapsulant on the first solar cell. A fifth operation 255 can include placing a substantially transparent layer on the first encapsulant. A sixth operation 256 can include placing a backing material on the metal foil. A seventh operation 257 can include placing a back layer on the backing material. A last operation 258 can include bonding the substantially transparent layer, first encapsulant, first solar cell, metal foil, backing material and back layer together forming a photovoltaic laminate.

Figure 29:
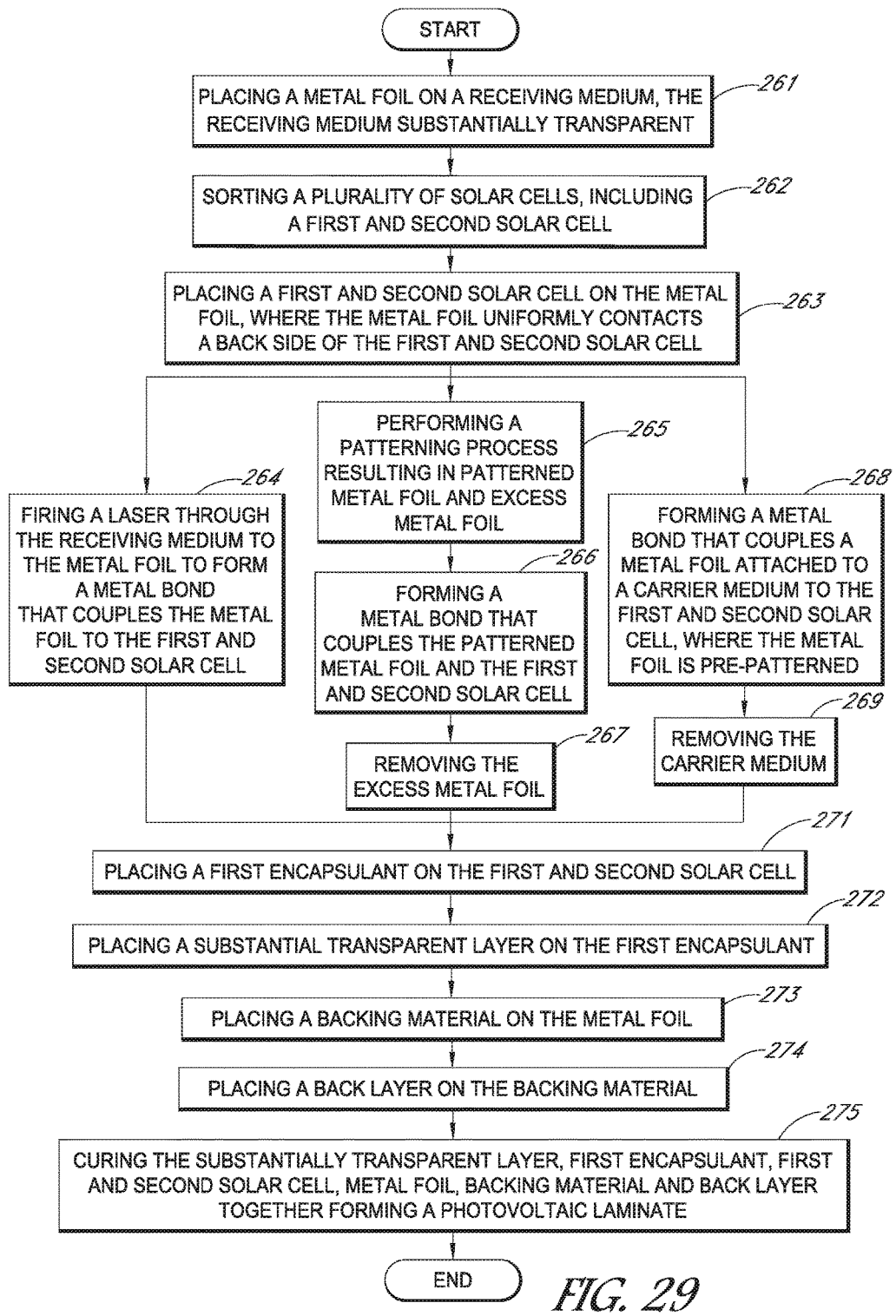

With reference to FIG. 29, a flow chart of another embodiment for a method of metallization for a photovoltaic laminate is shown. As described above, the first operation 261 can include placing a metal foil on a receiving medium, the receiving medium substantially transparent. A second operation 262 can include sorting a plurality of solar cells, including a first and second solar cell. A third operation 263 can include placing a first and second solar cell on the metal foil, where the metal foil uniformly contacts a back side of the first and second solar cell. A fourth operation 264 can include firing a laser through the receiving medium to the metal foil to form a metal bond that couples the metal foil to the first and second solar cell. Embodiments of the fourth operation 264 can include three steps, a first step 265 can include performing a patterning process resulting in patterned metal foil and excess metal foil, a second step 266 can include forming a metal bond that couples the patterned metal foil and the first and second solar cell and a third step 267 can include removing the excess metal foil. Embodiments of the fourth operation 264 can include two steps, a first step 268 can include forming a metal bond that couples a metal foil attached to a carrier medium to the first and second solar cell, where the metal foil is pre-patterned and a second step 269 can include removing the carrier medium. A fifth operation 271 can include placing a first encapsulant on the first and second solar cell. A sixth operation 272 can include placing a substantially transparent layer on the first encapsulant. A seventh operation 273 can include placing a backing material on the metal foil. An eighth operation 274 can include placing a back layer on the backing material. A last operation 275 can include curing the substantially transparent layer, first encapsulant, first and second solar cell, metal foil, backing material and back layer together forming a photovoltaic laminate. As discussed above, placing a first and second solar cell illustrates the above methods can be used with a plurality of solar cells and not just one or two solar cells.

The methods of FIGS. 1-15 can also include the following embodiments. In an embodiment, the method can include patterning busbars and ribbon from the metal foil 130 simultaneously during the formation of the metal bond 160 or metal contact region. In an embodiment, the busbars and ribbons can be patterned from the metal foil 130 separately from the formation of the metal bond 160. In the embodiment which includes storing alignment information of FIG. 1, the method can also include forming a metal bond 160 that couples the metal foil 130 to the first solar cell 120 according to the stored alignment information. In the embodiment which includes forming the metal bond 160 or a metal contact region, the method can include modifying laser firing parameters to prevent damage to the solar cell 120. In an embodiment, the method can include connecting a metal interconnect to the metal foil 130 after forming the metal bond 160. In some embodiments, the method can include performing an electrical continuity check to check for shorts. In an embodiment, the photovoltaic laminate 100 can be repaired of any shorts or electrical damage after testing, such as prior to solar cell placement for pre-patterned metal foil or after to solar cell placement for both pre-patterned and an in-situ patterned metal foil.

As mentioned above, the photovoltaic laminate 100 can have a front side 102 which faces the sun during normal operation and a back side 104 opposite the front side 102. The photovoltaic laminate 100 can also include a substantially transparent layer 110, a first encapsulant layer 112 on the substantially transparent layer 110, and a metal foil 130 on the first solar cell 120. In an embodiment, the metal foil 130 uniformly contacts the first solar cell 120. The photovoltaic laminate 100 can also include a metal bond 160 electrically coupling the metal foil 130 to the first solar cell 120. In some embodiments the metal bond 160 can include a metal contact region. The photovoltaic laminate 100 can include a backing material 142 on the metal foil 130 and a back layer 140 on the backing material 142. In some embodiments, the photovoltaic laminate 100 of can include a plurality of solar cells. Embodiments can also include, as shown in FIGS. 7 and 15, a photovoltaic laminate 100 where a metal bond 160 electrically couples the metal foil 130 to a seed metal layer 121 on the first solar cell 120.

As also mentioned above, the photovoltaic laminate 100 of FIGS. 1-15 can include a solar 120 cell. All methods mentioned above are applicable to different types of solar cells including, but not limited to, a linear single-axis design, allowing for high throughput process during a metal bond formation step, simplifying the alignment and reducing tool complexity. In an embodiment, the solar cell 120 can include a thin amorphous silicon layer on the back side of the first solar cell 120. In some embodiments, the amorphous silicon layer allows for an increase in a laser process window, (e.g., for cell architectures with a back-side dielectric stack of different thicknesses of the P-type and N-type doped regions). In an embodiment, the amorphous silicon can be doped, where the dopant can be N-type or P-type dopant. Embodiments can include providing a solar cell selected from the group consisting of a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, and a cadmium telluride solar cell.

In some embodiments, the solar cell 120 of FIGS. 1-15 can be a back contact solar cell having a silicon substrate, doped regions on the silicon substrate, an amorphous silicon layer, a trench region separating the doped regions and a back anti-reflective coating (BARC) on a back side of the solar cell 120. In the embodiment where the solar cell 120 is composed of a back contact solar cell, the solar cell 120 can include a texturized region on the silicon substrate and an anti-reflective coating (ARC) on the texturized region. In some embodiments, the solar cell can include a seed metal layer formed on a silicon substrate of the solar cell as shown in FIG. 5. Also shown in FIG. 5, the metal bond 160 can electrically couple the metal foil 130 to the seed metal layer 121 on the first solar cell 120. In an embodiment, a dielectric layer can be formed between the seed metal layer 121 forming a first and second busbar busbar 131, 133, where the first and second busbar busbar 131, 133 metal can be folded over the first solar cell 120 to reduce frame-size. Embodiments include a seed metal layer including a metal such as, but not limited to, copper, tin, tungsten, titanium, titanium tungsten, silver, gold, titanium nitride, tantalum nitride, ruthenium, or platinum.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for metallization for a photovoltaic laminate, the method comprising:
   placing a first encapsulant on a substantially transparent layer;
   placing a first solar cell on the first encapsulant;
   placing a metal foil on the first solar cell, wherein a first surface of the metal foil uniformly contacts the first solar cell;
   forming a metal bond that couples the metal foil to the first solar cell; and
   after forming the metal bond that couples the metal foil to the first solar cell, placing another layer directly on a second surface of the metal foil.

2. The method of claim 1 wherein the other layer comprises a backing material, and the method further comprises:
   placing the backing material on the second surface of the metal foil;
   forming a back layer on the backing material; and
   bonding the substantially transparent layer, the first encapsulant, the first solar cell, the metal foil, the backing material and the back layer to form a photovoltaic laminate.

3. The method of claim 1, further comprising placing a second solar cell on the first encapsulant.

4. The method of claim 3, further comprising before placing the first solar cell on the first encapsulant, sorting a plurality of solar cells, wherein placing the first and second solar cells is performed according to the sorting.

5. The method of claim 1, wherein forming the metal bond includes forming a metal contact region using a laser source, wherein the formed metal contact region electrically couples the metal foil to the first solar cell.

6. The method of claim 1, wherein forming the metal bond comprises:
   performing a patterning process resulting in a patterned metal foil and an excess metal foil;
   forming the metal bond that couples the patterned metal foil to the first solar cell; and
   removing the excess metal foil.

7. The method of claim 1, wherein forming the metal bond comprises:
   forming the metal bond that couples the metal foil attached to a carrier medium to the first solar cell, wherein the metal foil is pre-patterned; and
   after forming the metal bond, removing the carrier medium.

8. The method of claim 2, wherein bonding the substantially transparent layer, the first encapsulant, the first solar cell, the metal foil, the backing material and the back layer to form the photovoltaic laminate includes performing a method selected from the group consisting of curing, thermal curing, curing with Ultra Violet light and performing a standard lamination process to form a photovoltaic laminate.

9. A method for metallization for a photovoltaic laminate, the photovoltaic laminate having a front side which faces the sun during normal operation and a back side opposite the front side, the method comprising:
   placing a first encapsulant on a substantially transparent layer that comprises the front side of the photovoltaic laminate;
   placing a first solar cell on the first encapsulant;
   placing a metal foil on the first solar cell, wherein a first surface of the metal foil uniformly contacts a back side of the first solar cell;
   forming a metal bond that couples the metal foil to the first solar cell;
   after forming the metal bond that couples the metal foil to the first solar cell, placing a backing material directly on a second surface of the metal foil;
   forming a back layer on the backing material layer; and
   curing the substantially transparent layer, the first encapsulant, the first solar cell, the metal foil, the backing material and the back layer to form a photovoltaic laminate.

* * * * *